United States Patent
Yun

(10) Patent No.: US 6,348,716 B1
(45) Date of Patent: Feb. 19, 2002

(54) HORIZONTAL MOS GATE TYPE SEMICONDUCTOR DEVICE INCLUDING ZENER DIODE AND MANUFACTURING METHOD THEREOF

(75) Inventor: Chong-Man Yun, Seoul (KR)

(73) Assignee: Fairchild Korea Semiconductor, Ltd., Kyungki-do (KR)

( * ) Notice: Subject to any disclaimer, the term of this patent is extended or adjusted under 35 U.S.C. 154(b) by 0 days.

(21) Appl. No.: 09/452,201

(22) Filed: Dec. 2, 1999

(30) Foreign Application Priority Data

Dec. 17, 1998 (KR) .............................................. 98-55733

(51) Int. Cl.[7] .............................................. H01L 23/62
(52) U.S. Cl. ...................... 257/356; 257/328; 257/360; 327/109; 438/212; 438/268
(58) Field of Search ..................... 327/109; 257/328, 257/356, 360; 438/212, 268

(56) References Cited

U.S. PATENT DOCUMENTS 5,276,370 A * 1/1994 Nishiura et al. ............ 327/109
5,973,359 A * 10/1999 Kobayashi et al. .......... 257/328

FOREIGN PATENT DOCUMENTS

FR          2616579 A    * 12/1988

* cited by examiner

Primary Examiner—Nathan Flynn
Assistant Examiner—Scott R. Wilson
(74) Attorney, Agent, or Firm—Rothwell, Figg, Ernst & Manbeck

(57) ABSTRACT

A lateral MOS gate semiconductor device including Zener diodes has a structure in which the Zener diodes are integrated within the device. The Zener diodes are connected in parallel to a parasitic diode within the device, between drain and source terminals, and have a relatively low breakdown voltage. Accordingly, when a large reverse voltage is applied due to an avalanche energy generated by an inductive load upon turning off the device, breakdown occurs in the Zener diodes before the internal parasitic diode, thus allowing reverse current to flow from the drain terminal to the source terminal through the Zener diodes. As described above, the reverse current flows through the Zener diodes, rather than through the parasitic diode, so that a parasitic bipolar junction transistor is prevented from being turned on. Therefore, the device can endure a high avalanche energy.

14 Claims, 12 Drawing Sheets o : p-IMPURITY ION

○ : p—IMPURITY ION
● : n—IMPURITY ION o : p-IMPURITY ION

○: p—IMPURITY ION
●: n—IMPURITY ION

HORIZONTAL MOS GATE TYPE SEMICONDUCTOR DEVICE INCLUDING ZENER DIODE AND MANUFACTURING METHOD THEREOF

BACKGROUND OF THE INVENTION

1 Field of the Invention

The present invention relates to a power MOS gate type semiconductor device and a manufacturing method thereof, and more particularly, to a lateral MOS gate type semiconductor device including a Zener diode, and a manufacturing method thereof.

2. Description of the Related Art

Recently, power integrated circuit techniques for integrating a power semiconductor device having a high voltage and a large current and a driving circuit therefor into one chip have been rapidly developed. Lateral power semiconductor devices are generally used as power semiconductor devices which are incorporated into power integrated circuits. However, in lateral power semiconductor devices, current is horizontally conducted, and thus only a small amount of current can be conducted per unit area. Also, in the case of MOS gate type semiconductor devices, most of the current flows along the surface of the device, so that a small safe operating area is provided and ensuring reliability is not easy. Furthermore, when the lateral power semiconductor devices are connected to an inductive load, they cannot endure high avalanche energies.

FIG. 1 is a cross-sectional view showing the flow of drain current (indicated by the arrow) within a conventional lateral MOS gate type semiconductor device connected to an inductive load.

Referring to FIG. 1, an n-type low-concentration drift layer 2 is formed on an n-type high-concentration semiconductor substrate 1. The drift layer 2 can be formed by growing an n-type epitaxial layer on the semiconductor substrate 1. A p-type well region 3 is formed in a predetermined area below the upper surface of the drift layer 2. An n-type high-concentration source region 4 is formed within the p-type well region 3. An n-type high-concentration drain region 5 is formed below the surface of the n-type drift layer 2, being spaced a predetermined distance apart from the p-type well region 3. A gate electrode 7 is formed over a channel forming area of the p-type well region 3, having a gate oxide layer 6 interposed between the gate electrode 7 and the p-type well region. A source electrode 8 is formed such that it is electrically connected to the source region 4, and a drain electrode 9 is formed such that it is electrically connected to the drain region 5.

When the lateral MOS gate-type semiconductor device is connected to an inductive load and turned on, a considerable amount of energy is stored in the inductor of the inductive load, and must be discharged through the drain and source electrodes when the device is turned off. During this period, a high reverse voltage is applied between the drain and source electrodes, and thus the state of the junction portion between the p-type well region 3 and the n-type drift region 2 abruptly changes into an avalanche state. Then, a current from the inductor goes through a resistor (Rb) under the n-type high-concentration source region 4 via a parasitic pn diode formed by the junction portion between the p-type well region 3 and the n-type drift region 2, and flows into the source electrode 8 as indicated by an arrow in FIG. 1. Here, the drop in voltage across the resistor Rb forward-biases the junction portion between the p-type well region 3 and the n-type source region 4. When the voltage drop across the resistor Rb is greater than or equal to a predetermined value (i.e., 0.7V), carriers start being injected through the n-type high-concentration source region 4 as well as the p-type well region 3. That is, a parasitic npn bipolar junction transistor comprised of the n-type source region 4, the p-type well region 3, and the n-type drift region 2 starts being turned on. Therefore, the parasitic pn diode formed by the junction portion between the p-type well region 3 and the n-type drift region 2 can resist avalanche energies only until the parasitic npn bipolar junction transistor is turned on.

However, a general lateral MOS gate-type transistor includes a parasitic pn diode of a small capacity, and furthermore cannot resist high avalanche energies because it is easy to turn on the parasitic bipolar junction transistor, as described above. Hence, it is very important to avoid turn-on of the parasitic bipolar junction transistor so that the parasitic bipolar junction transistor can endure the high avalanche energies.

To do this, there has been proposed a method of reducing the value of the resistor Rb under the n-type high-concentration source region by increasing the concentration of the p-type well region, in the prior art. However, this method has problems in that the threshold voltage increases, the current conducting ability is degraded, and the step of forming a mask film must be added in the device manufacturing method. There is also a method in which the device can resist avalanche energies by virtue of a special diode installed at the exterior of the device. This method increases the cost, and becomes quite complicated in terms of system design.

SUMMARY OF THE INVENTION

To solve the above problems, it is an object of the present invention to provide a lateral MOS gate-type semiconductor device including a Zener diode, which can resist a large amount of avalanche energy without turning on a parasitic bipolar transistor.

It is another object of the present invention to provide a method of manufacturing the lateral MOS gate-type semiconductor device including a Zener diode.

Accordingly, to achieve the first object, a lateral MOS gate semiconductor device according to an embodiment of the present invention incudes a drift layer of a first conductivity type, formed on a semiconductor substrate, and a well region of a second conductivity type that is opposite to the first conductivity type, formed in a given area below the upper surface of the drift layer. A first high-concentration source region is formed in a given area in the well region, and a high-concentration drain region of a first conductivity type is separated from the well region by a predetermined distance in a predetermined area below the upper surface of the drift layer. A plurality of Zener diodes having a predetermined breakdown voltage are separated from the drift layer to act as a passage for moving carriers from the drain region to the source region. A gate electrode is formed on a predetermined channel forming area of the well region, having a gate insulative film formed between the gate electrode and the predetermined channel forming area. A source electrode is formed so as to be electrically connected to the source region. A drain electrode is formed so as to be electrically connected to the drain region.

In the present invention, the semiconductor substrate is of a first conductivity type high concentration or a second conductivity type high-concentration. When the semiconductor substrate is of the first conductivity type, the lateral MOS gate-type semiconductor device further incudes an insulative film interposed between the semiconductor substrate and the drift layer.

It is preferable that first conductive regions and second conductive regions constituting the Zener diodes are connected to each other in series, perpendicularly to the direction of current flow in the drift layer. Here, the first and second conductive regions alternate within the polycrystalline silicon film, and the first conductive regions are positioned at both ends of the polycrystalline silicon film. In particular, it is preferable that one first conductive region of the two positioned at both ends of the polycrystalline silicon film is connected directly to the drain region, and the other first conductive region is connected to the source region. The first conductive region connected to the source region can be connected directly to the source region, or connected to the source region via the gate electrode.

In some circumstances, the first conductive regions and second conductive regions constituting the Zener diodes can be connected to each other in series such that they are parallel to the direction of current flow in the drift layer. In this case, the first and second conductive regions alternate within the polycrystalline silicon film, and the first conductive region and the second conductive region are positioned respectively at both ends of the polycrystalline silicon film. The first conductive region positioned at one end of the polycrystalline silicon film is connected directly to the drain region, and the second conductive region positioned at the other end of the polycrystalline silicon film is connected directly to the gate electrode. Here, it is preferable that the gate electrode is of a first conductivity type. Also, it is preferable that a diode for acting as a passage for the flow of current from the Zener diodes into the source region is further formed between the gate electrode and the source region.

FIG. 5 is a perspective view of a MOS gate-type semiconductor device including a Zener diode, according to a second embodiment of the present invention. In the first embodiment described referring to FIG. 2, no problems occur when the first embodiment is used as an independent device. However, when several devices are formed together within the same substrate as in a BiCDMOS device, problems occur. For example, when the n-type drift layer 110 of FIG. 2 is also used as the well region of another device, e.g., a CMOS transistor, other devices can be damaged by an excessive drain voltage. In order to prevent this problem, a high-concentration isolation region must be formed between adjacent devices. In the second embodiment, to solve the above problem, a p-type substrate is used as a semiconductor substrate, and an n-type well region is formed in the drain region, thereby preventing an influence on other devices formed on the same substrate. This is the difference from the first embodiment.

To achieve the first object, a lateral MOS gate semiconductor device according to another embodiment of the present invention includes a well region of the first conductivity type and a well region of a second conductivity type formed in areas below the upper surface of a semiconductor substrate of a first conductivity type such that they are a predetermined distance apart from each other. A high-concentration source region of the second conductivity type is formed in a given area in the well region of the first conductivity type, and a high-concentration drain region of the second conductivity type is formed in a predetermined area in the well region of the second conductivity type. A plurality of Zener diodes having a predetermined breakdown voltage are separated from the semiconductor substrate to act as a passage for moving carriers from the drain region to the source region. A gate electrode is formed on a channel forming area of the well region of the second conductivity type, having a gate insulative film interposed between the gate electrode and the channel forming area. A source electrode is formed so as to be electrically connected to the source region. A drain electrode is formed so as to be electrically connected to the drain region.

To achieve the second object, in a method of manufacturing a lateral MOS gate semiconductor device according to an embodiment of the present invention, an oxide film is formed on a semiconductor substrate, and a field oxide film for defining active regions is formed by growing only part of the oxide film. A polycrystalline silicon film is formed on the oxide film and the field oxide film, and then patterned, thus forming a first polycrystalline silicon film for gate electrodes and a second polycrystalline silicon film for Zener diodes. A first mask film pattern for forming a well region and the first conductive regions of the second polycrystalline silicon film, is formed, and impurity ions of a first conductivity type are implanted using the first mask film pattern as an ion implantation mask. A second mask film pattern for forming a source region, a drain region, and the regions of the second conductivity type of the second polycrystalline silicon film, is formed, and impurity ions of the second conductivity type are implanted using the second mask film pattern as an ion implantation mask. Then, the impurity ions of the first and second conductivity types are drive-in implanted.

Here, it is preferable that the step of electrically connecting the two regions of the first conductivity types formed at both ends of the second polycrystalline silicon film, to the drain region and the source region, respectively, is further included.

To achieve the second object, in a method of manufacturing a lateral MOS gate semiconductor device according to another embodiment of the present invention, an oxide film is formed on a semiconductor substrate, and a field oxide film for defining active regions is formed by growing only part of the oxide film. A polycrystalline silicon film is formed on the oxide film and the field oxide film. A first mask film pattern for forming a well region, a gate electrode, and the first conductivity type regions of Zener diodes on the polycrystalline silicon film, is formed on the polycrystalline silicon film. Impurity ions of the first conductivity type are implanted using the first mask film pattern as an ion implantation mask. A second mask film pattern for forming a source region, a drain region, and the second conductivity type regions of the Zener diodes, is formed on the polycrystalline silicon film. Impurity ions of the second conductivity type are implanted using the second mask film pattern as an ion implantation mask. The first and second impurity ions are drive-in diffused.

Here, it is preferable that the method further includes the steps of: electrically connecting a first conductivity type region which is the closest to the drain region, among the first conductivity type regions of the Zener diodes, to the drain region; and electrically connecting the gate electrode to the source region.

In the MOS gate-type semiconductor device including a Zener diode according to the present invention, Zener diodes, which are separated from a parasitic diode within the device and and have a relatively small breakdown voltage, are each connected to the drain and source regions. Accordingly, even when a high reverse voltage is applied, the Zener diode breaks down before the parasitic diode breaks down. Thus, even when a high reverse voltage is applied, a parasitic bipolar junction transistor is not turned on. Therefore, the device can endure high avalanche energies due to an inductive load when it is turned off, so that the ruggedness and the stability of the device are improved. Also, according to a manufacturing method thereof, the Zener diode can be incorporated into the MOS gate-type semiconductor device without forming an additional mask layer.

BRIEF DESCRIPTION OF THE DRAWINGS

The above objects and advantage of the present invention will become more apparent by describing in detail preferred embodiments thereof with reference to the attached drawings in which.

DESCRIPTION OF THE PREFERRED EMBODIMENTS

Figure 1:
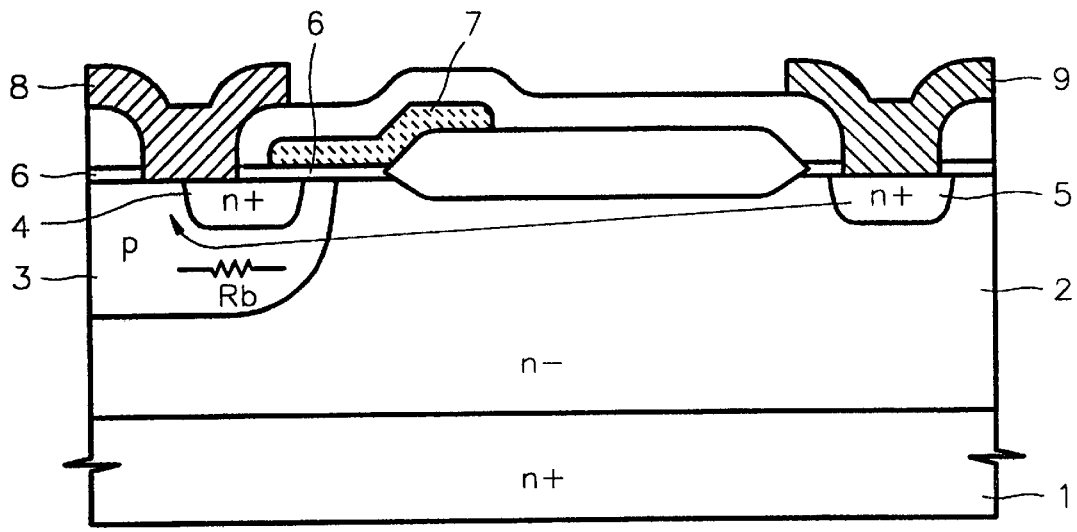
FIG. 1 is a cross-sectional view illustrating the flow of drain current in a conventional lateral MOS gate-type semiconductor device connected to an inductive load.

Hereinafter, embodiments of the present invention will be described in detail with reference to the attached drawings. However, the embodiments of the present invention can be modified into various other forms, and the scope of the present invention must not be interpreted as being restricted to these embodiments. These embodiments are provided to more completely explain the present invention to those skilled in the art. In the drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Figure 2:
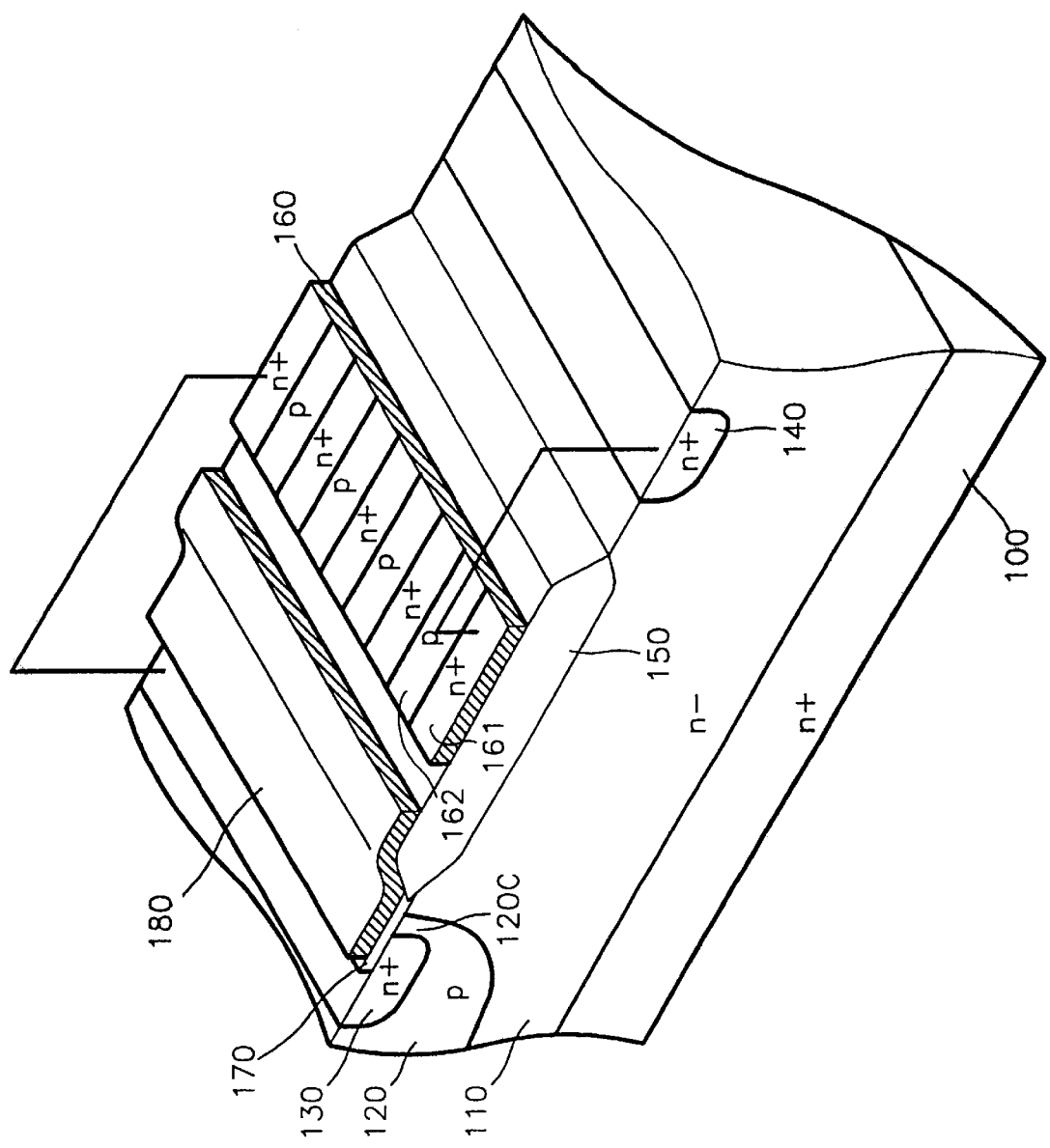
FIG. 2 is a perspective view of a lateral MOS gate-type semiconductor device including a Zener diode, according to a first embodiment of the present invention.

FIG. 2 is a perspective view of a lateral MOS gate-type semiconductor device including a Zener diode, according to a first embodiment of the present invention.

Referring to FIG. 2, an n-type low-concentration drift layer 110 is formed on an n-type high-concentration semiconductor substrate 100. In some circumstances, an insulative layer, e.g., a silicon-on-insulator (SOI) structure having an oxide film formed between the semiconductor substrate 100 and the drift layer 110, can be used. In the case of an insulated gate bipolar transistor, a p-type semiconductor substrate is used instead of the n-type semiconductor substrate 100. The drift layer 110 can be formed by growing an n-type epitaxial layer on the semiconductor substrate 100, but it is not limited to this formation method. A p-type well region 120 is formed in a predetermined area below the upper surface of the drift layer 110. An n-type high-concentration source region 130 is formed within the p-type well region 120, and an n-type high-concentration drain region 140 is formed below the surface of the n-type drift region 110 such that it is separated from the p-type well region 120 by a predetermined distance. The source and drain regions 130 and 140 are separated from each other by a field oxide film 150.

Zener diodes 160 having a predetermined breakdown voltage are formed on the field oxide film 150 so as to be connected to each other in series in a direction perpendicular to the direction of current flow within the drift region 110. The Zener diodes 160 are installed to provide a passage for moving carriers from the drain region 140 to the source region 130, and each has a structure in which an n-type region 161 and a p-type region 162 alternate in a polycrystalline silicon film. With the alternate formation of the n-type and p-type regions 161 and 162 in the polycrystalline silicon film, an n-p junction and a p-n junction alternate in a direction perpendicular to the direction of current flowing in the drift region 110. Since the n-p junction and the p-n junction constitute Zener diodes, they have the same effect as the serial formation of a plurality of Zener diodes. Here, the breakdown voltage of the Zener diodes must be smaller than the breakdown voltage of a parasitic pn diode formed by the p-type well region 120 and the n-type drift region 110. This is because the Zener diodes must enter into an avalanche state before the parasitic pn diode is entered, to allow a current from an inductor to flow through the Zener diodes rather than through the parasitic pn diode. The breakdown voltage of the Zener diodes can be controlled by adjusting the number of p-n junctions (or n-p junctions) of the Zener diode.

The n-type region 161 is situated at both ends of the polycrystalline silicon film in order to restrict the conduction of carriers through the Zener diodes 160 to when the device is turned off. The n-type regions at both ends of the polycrystalline silicon film can be directly connected to the drain and source regions 140 and 130, respectively, or can be connected thereto via a gate terminal. These connections can be accomplished by using an appropriate conductive layer after forming a typical contact, but are not limited to this method.

A gate electrode 180 is formed on a channel forming region 120c in the p-type well region 120, with a gate oxide film 170 interposed therebetween. Also, a source electrode (not shown) is electrically connected to the source region 130, and a drain electrode (not shown) is electrically connected to the drain region 140.

Figure 3:
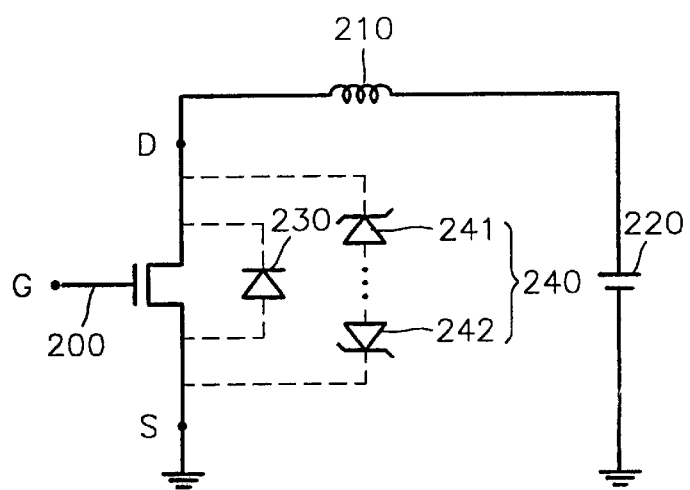
FIG. 3 is a circuit diagram of the lateral MOS gate-type semiconductor device of FIG. 2 connected to an inductive load.
Figure 4:
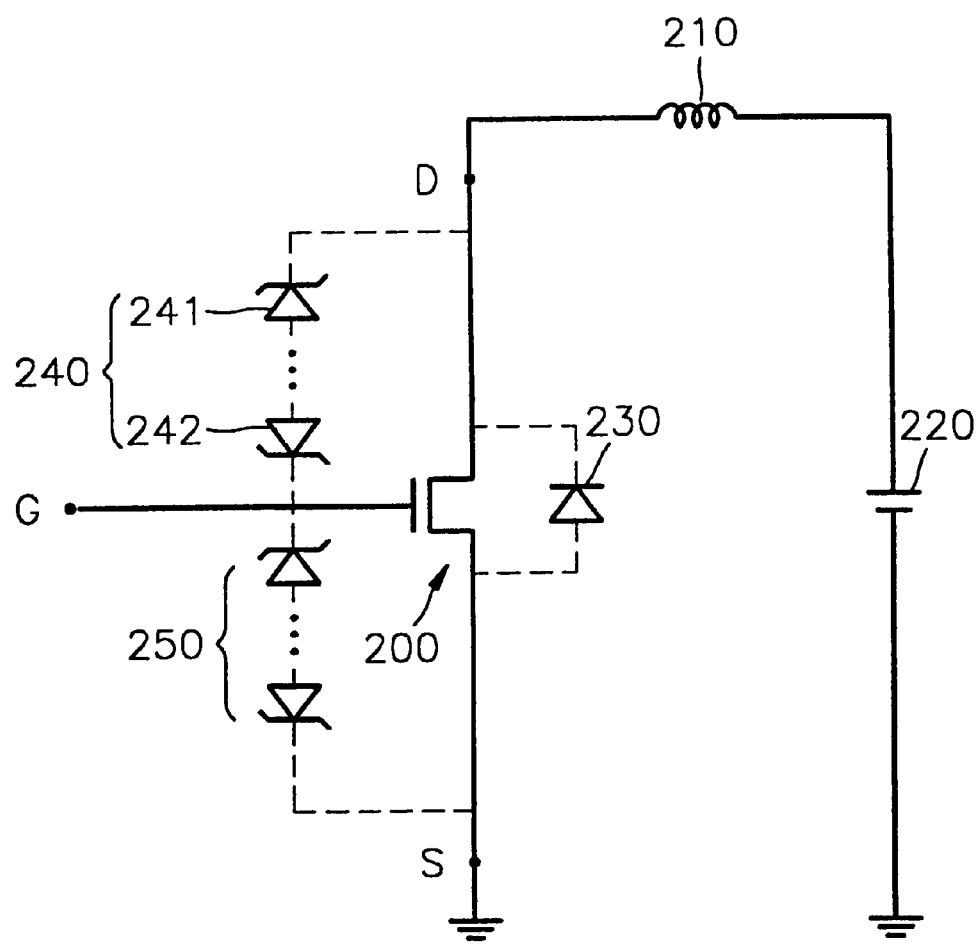
FIG. 4 is a circuit diagram of a lateral MOS gate-type semiconductor device including a Zener diode according to a second embodiment of the present invention, the device connected to an inductive load.

FIGS. 3 and 4 are circuit diagrams of lateral MOS gate-type semiconductor devices according to the present invention which are connected to an inductive load. FIG. 3 illustrates the case in which Zener diodes are directly connected between drain and source terminals, and FIG. 4 illustrates the case in which Zener diodes are directly connected to the drain terminal and connected to the source terminals via a gate terminal. Like reference numerals in FIGS. 3 and 4 denote the same regions or members.

Referring to FIGS. 3 and 4, the drain terminal D of a lateral MOS gate-type semiconductor device 200 is connected in series to the positive terminal of an external power source 220 via an inductor 210 as an inductive load. The source terminal S of the lateral MOS gate-type semiconductor device 200 is grounded, and so is the negative terminal of the external source 220. A parasitic diode 230 and Zener diodes 240 are originally installed in the lateral MOS gate-type semiconductor device 200, but they are shown outside for convenience sake. The parasitic diode 230 is an internal parasitic pn diode formed by the p-type well region 120 of FIG. 2 and the n-type drift layer 110 of FIG. 2 within the lateral MOS gate-type semiconductor device 200. The Zener diodes 240 are a plurality of Zener diodes formed in opposite directions as described above, but the Zener diodes in the middle are all not shown for simplicity. In FIG. 3, reference numeral 241 denotes a Zener diode in which its n-type region is connected directly to the drain terminal D, and reference numeral 242 denotes another Zener diode in which its n-type region is connected directly to the source terminal S. On the other hand, reference numeral 241 in FIG. 4 denotes a Zener diode in which its n-type region is connected directly to the drain terminal D, but reference numeral 242 denotes another Zener diode in which its n-type region is connected to a gate terminal G. In FIG. 4, still another Zener diode 250 is formed between the gate terminal G and the source terminal S to allow carriers flowing via the Zener diode 240 to flow to the source terminal S. In a general MOS gate semiconductor device comprised of a plurality of unit cells, a source electrode is shared by adjacent cells. In this case, the Zener diodes 250 between the gate terminal G and the source terminal S can be formed between a gate electrode and a source electrode within the MOS gate-type semiconductor device.

The operation of the lateral MOS gate semiconductor device connected to an inductive load when it is turned off will now be described in more detail with reference to FIGS. 2 and 3 (or FIG. 4).

When the lateral MOS gate-type semiconductor device 200 connected to an inductive load is turned on, a considerable amount of energy is stored in the inductor 210 as the inductive load. This energy must be discharged via the drain terminal D and the source terminal S when the device is turned off. During this turn-off period, a high reverse voltage is applied to the drain and source regions 140 and 130. Here, the breakdown voltage of the Zener diode 240 is smaller than that of the parasitic diode 230, so Zener breakdown occurs in the Zener diode 240 before the parasitic diode 230. Therefore, a large amount of reverse voltage directly flows from the drain region 140 to the source region 130 via the Zener diode 240 (see FIG. 3), or flows to the source region 130 through the gate terminal (see FIG. 4). The reverse current does not flow through the parasitic diode 230, and, thus, no drop in voltage due to a reverse current flowing through the p-type well region 120 below the source region 130 occurs. Therefore, the parasitic bipolar junction transistor, which is formed by the n-type source region 130, the p-type well region 120, and an n-type drift layer 110, is not turned on. As described above, the Zener diodes 240 can allow the device to endure a sufficiently large amount of avalanche energy while the parasitic bipolar junction transistor is not turned on, so that the stability of the device is improved.

Figure 5:
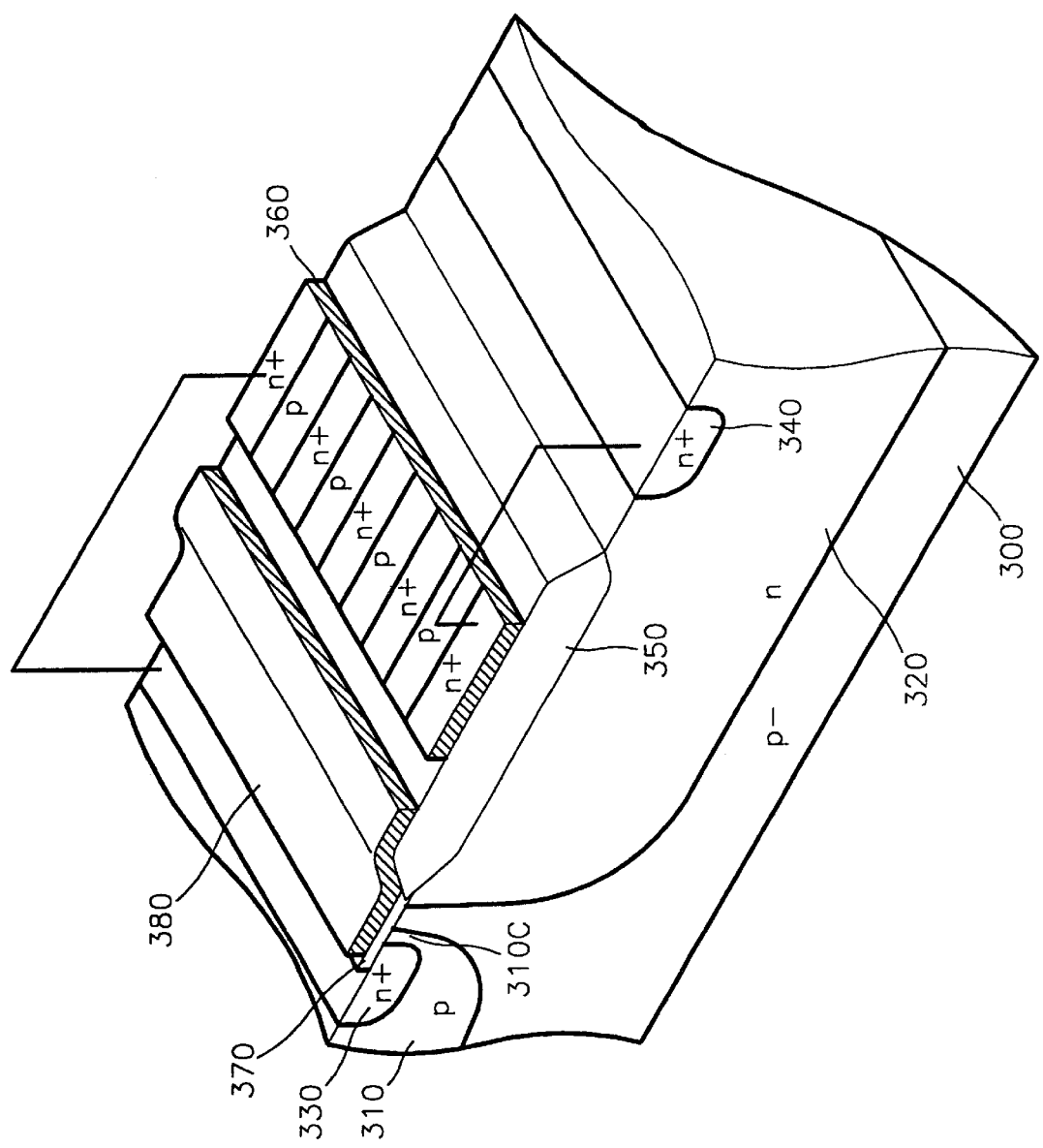
FIG. 5 is a perspective view of a lateral MOS gate-type semiconductor device including a Zener diode, according to a third embodiment of the present invention.

FIG. 5 is a perspective view of a MOS gate-type semiconductor device including a Zener diode, according to a third embodiment of the present invention. In the first embodiment described referring to FIG. 2, no problems occur when the first embodiment is used as an independent device. However, when several devices are formed together within the same substrate as in a BiCDMOS device, problems occur. For example, when the n-type drift layer 110 of FIG. 2 is also used as the well region of another device, e.g., a CMOS transistor, other devices can be damaged by an excessive drain voltage. In order to prevent this problem, a high-concentration isolation region must be formed between adjacent devices. In the second embodiment, to solve the above problem, a p-type substrate is used as a semiconductor substrate, and an n-type well region is formed in the drain region, thereby preventing an influence on other devices formed on the same substrate. This is the difference from the first embodiment.

Referring to FIG. 5, a p-type semiconductor substrate 300 is used in a MOS gate semiconductor device including a Zener diode according to the second embodiment of the present invention. A p-type well region 310 and an n-type well region 320 are spaced a predetermined distance apart from each other in given areas below the upper surface of the p-type semiconductor substrate 300. An n-type high-concentration source region 330 is formed in a given area within the p-type well region 310, and an n-type high-concentration drain region 340 is formed in a given area within the n-type well region 320. The source and drain regions 330 and 340 are separated from each other by a field oxide film 350.

Zener diodes 360 having a predetermined breakdown voltage are formed on the field oxide film 350. As described above, the Zener diodes 360 are installed to provide a passage for moving carriers from the drain region 340 to the source region 330, and are formed of a polycrystalline silicon film having n-type regions and p-type regions. An n-type region formed at one end of the Zener diodes 360 is connected directly to the drain region 340, and an n-type region formed at the other end thereof is connected directly to the source region 330 or connected thereto via a gate terminal.

A gate electrode 380 is formed so as to be insulatedly connected to a channel forming region 310c within the p-type well region 310 through a gate oxide film 370. Also, a source electrode (not shown) is electrically connected to the source region 330, and a drain electrode (not shown) is electrically connected to the drain region 340.

According to the second embodiment of the present invention, also in case that other devices such as a CMOS device or a bipolar junction transistor are formed on other areas of the semiconductor substrate 300, the n-type well region 320 surrounding the drain region 340 exists. Thus, the second embodiment has an effect in that the high potential of the drain region can not effect other adjacent devices. Also, the second embodiment includes the Zener diodes 360 having a lower breakdown voltage than the breakdown voltage of a parasitic diode within the device, such that the device can endure a large amount of avalanche energy without the parasitic bipolar junction transistor being turned on, even when it is connected to an inductive load.

Figure 6:
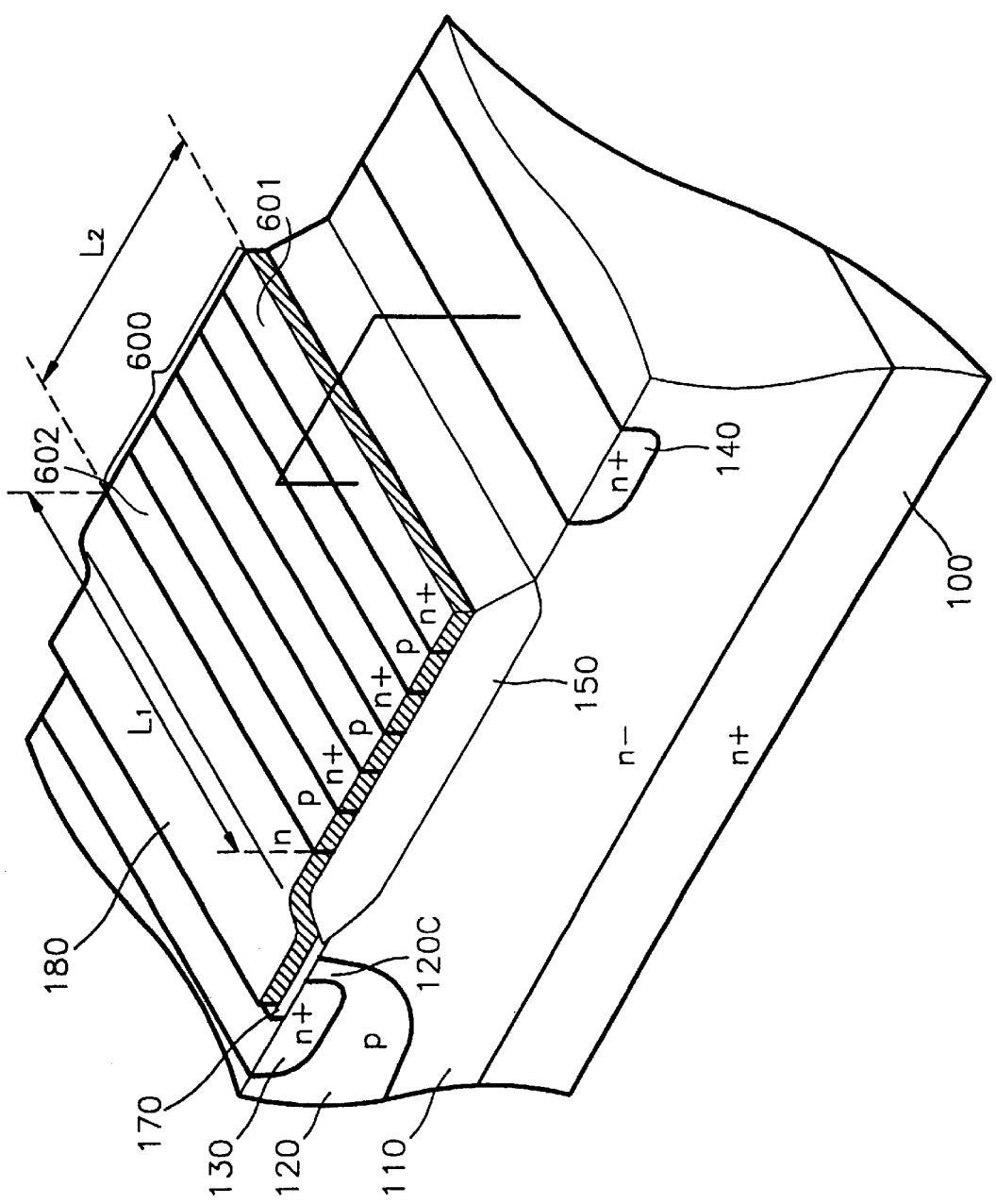
FIG. 6 is a perspective view of a lateral MOS gate-type semiconductor device including a Zener diode, according to a fourth embodiment of the present invention.

FIG. 6 is a perspective view of a lateral MOS gate-type semiconductor device including a Zener diode, according to a third embodiment of the present invention. The same reference numerals in FIG. 6 as those in FIG. 2 denote the same regions or members.

The third embodiment is different from the previous embodiments in that Zener diodes 600 formed on a field oxide film 150 are connected in series to each other in a direction parallel to the direction of current flow in the drift layer 110. To be more specific, a first length (L1) on the field oxide film 150 in a direction perpendicular to the direction of current flow in the drift layer 110 is longer than a second length (L2) on the field oxide film 150 in the direction parallel to the direction of current flow. Accordingly, in case that the Zener diodes 600 are connected to each other in series along the first length (L1), more Zener diodes 600 can be formed, as described above referring to FIG. 2, although a special patterning process is required after forming a polycrystalline silicon film for the gate electrode 180 and the Zener diodes 600. However, when the Zener diodes 600 are formed along the second length (L2) as in this embodiment, the number of Zener diodes 600 capable of being formed is reduced, but a special patterning process is not required after depositing a polycrystalline silicon film. Therefore, the Zener diodes according to this embodiment are more suitable for a MOS gate semiconductor device having a small capacity, e.g., 300V or less.

In these Zener diodes, an n-type region 601 formed closest to the drain region 140 is connected directly to the drain region 140, and another p-type region 602 formed closest to the gate electrode 180 is connected directly to the gate electrode 180. Here, the gate electrode 180 is doped with n-type impurities, so a junction between the gate electrode 180 and the p-type area 602 also forms one Zener diode. Also, other Zener diodes are formed between the gate electrode 180 and the source region 130 to act as a passage for allowing inductor currents from the drain region 140 to flow to a source terminal, but this is not shown in FIG. 6.

FIGS. 7 through 11 are cross-sectional views illustrating a method of manufacturing lateral MOS gate-type semiconductor devices including Zener diodes, according to preferred embodiments of the present invention.

Figure 7:
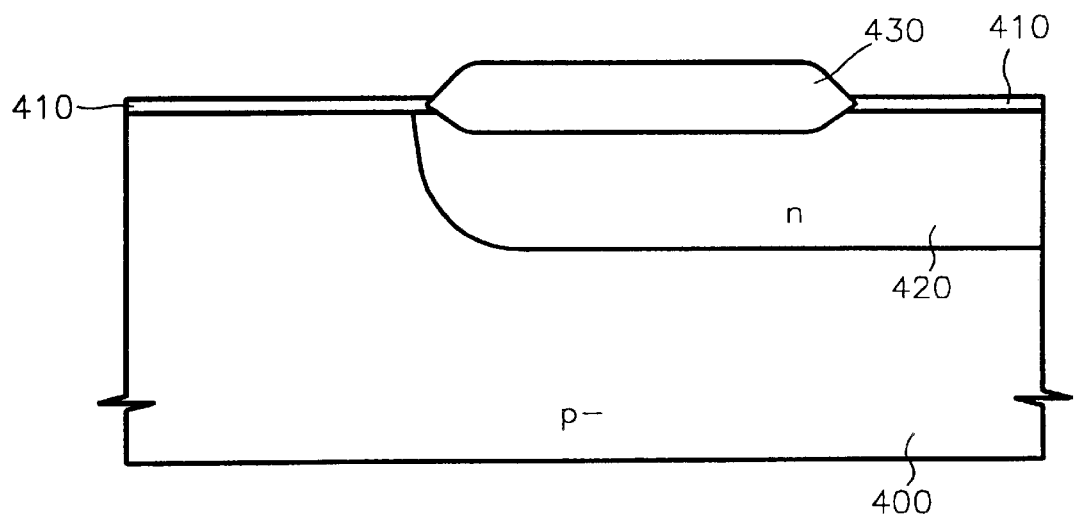
FIGS. 7 through 11 are cross-sectional views illustrating a method of manufacturing a lateral MOS gate-type semiconductor device including a Zener diode, according to a first embodiment of the present invention.

Referring to FIG. 7, an oxide film 410 is formed on a p-type semiconductor substrate 400. Then, an n-type well region 420 is formed in a predetermined area of the semiconductor substrate 400. In order to form the n-type well region 420, first, a photoresist film pattern, having an aperture exposing an area where the n-type well region is to be formed, is formed on the oxide film 410. Next, n-type impurity ions are implanted using the photoresist film pattern as an ion implantation mask, the photoresist film pattern is removed, and the implanted n-type impurity ions are drive-in diffused by a predetermined thermal treatment. In this way, the n-type well region 420 is formed. A field oxide film 430 for isolating drain and source regions from each other is then formed by the following process. First, a nitride film pattern is formed on the oxide film 410. The oxide film 410 is grown by using the nitride film pattern as a growth prevention mask. Then, a portion of the oxide film exposed by the nitride film pattern is allowed to grow, and the field oxide film 430 is thus formed. After removing the nitride film pattern, a typical sacrificial oxide film forming and removing process is performed to remove damage to the oxide film due to the nitride film pattern. A process for drive-in diffusing n-type impurity ions to form the n-type well region 420 is not separately performed, but may be performed in a process for growing the field oxide film 430.

Figure 8:
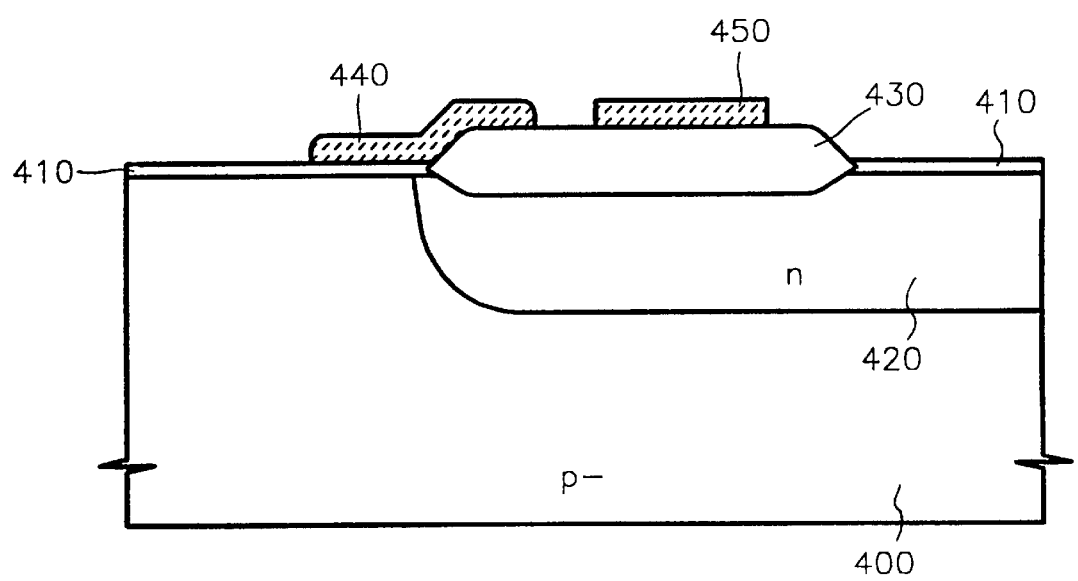

Referring to FIG. 8, a gate electrode 440 and a polycrystalline silicon film pattern 450 are simultaneously formed on the oxide film 410 and the field oxide film 430, respectively. To do this, first, a polycrystalline silicon film and a photoresist film are sequentially formed on the oxide film 410 and the field oxide film 430. A photoresist film pattern is formed by exposing and developing the photoresist film using a typical lithographic method. Here, the photoresist film pattern has apertures exposing only selected portions of the polycrystalline silicon film. Then, the polycrystalline silicon film is etched using the photoresist film pattern as an etch mask, thereby forming the gate electrode 440 and the polycrystalline silicon film pattern 450.

Figure 9A:
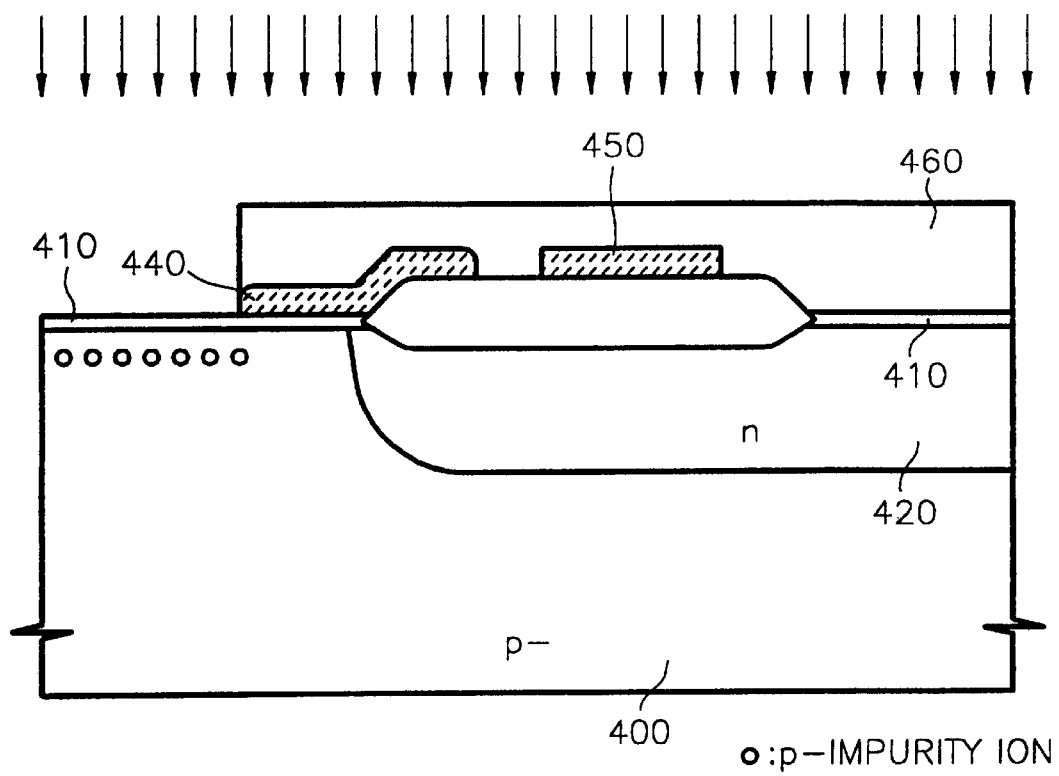
Figure 9B:
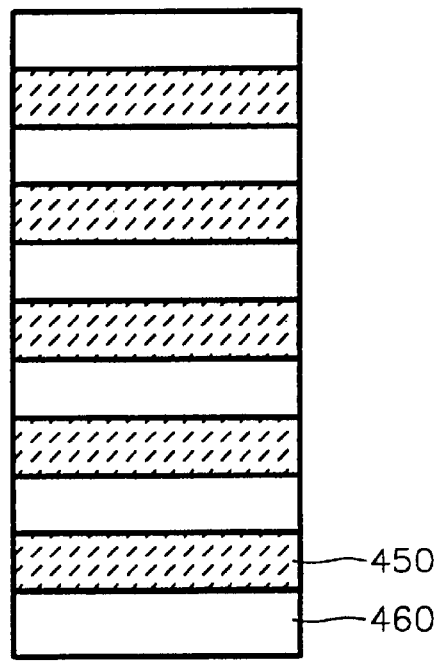

Referring to FIG. 9a, a photoresist film is formed on the entire surface of the resultant substrate, and a first photoresist film pattern 460 is then formed by exposing and developing the photoresist film using the typical lithographic method. The first photoresist film pattern 460 has an aperture exposing an area where the p-type well region is to be formed, and also apertures exposing selected areas of the polycrystalline silicon film pattern 450. FIG. 9b shows a structure viewed from the top in which the first photoresist film pattern 460 is formed on the strip-shaped polycrystalline silicon film pattern 450. As shown in FIG. 9b, the first photoresist film pattern 460 exposes areas where p-type regions of the polycrystalline silicon film pattern 450 are to be formed. Thereafter, p-type impurity ions are implanted using the first photoresist film pattern 460 as an ion implantation mask.

Figure 10A:
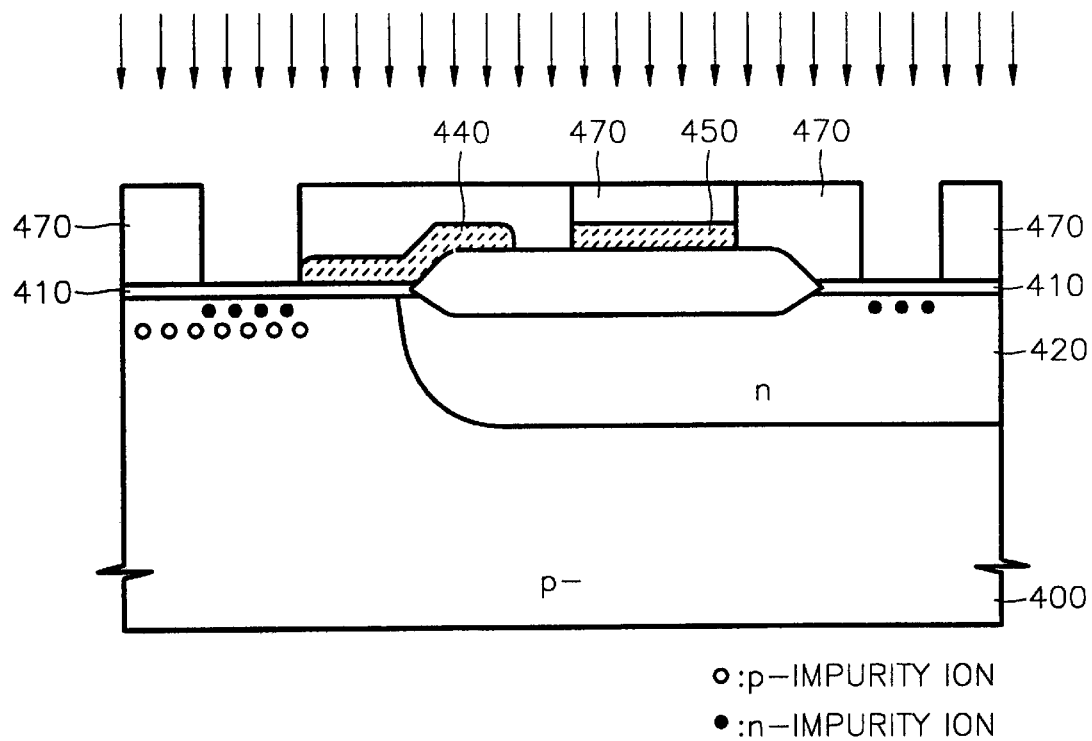
Figure 10B:
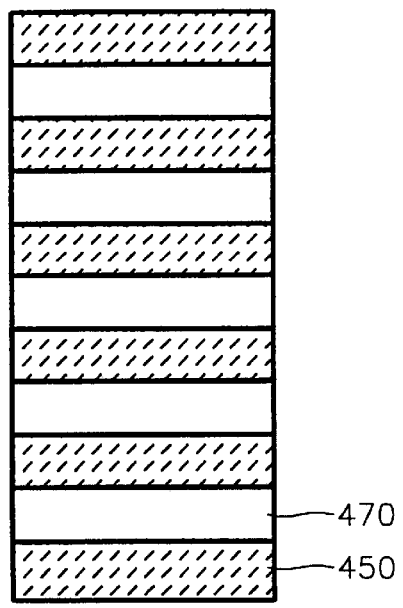

Referring to FIG. 10a, the first photoresist film pattern 460 of FIG. 9a is removed, and a second photoresist film pattern 470 is then formed. The second photoresist film pattern 470 has apertures exposing the surface of portions where n-type source and drain regions of the semiconductor substrate 400 are to be formed, and also has apertures exposing selected areas of the polycrystalline silicon film pattern 450. FIG. 10b shows a structure viewed from the top in which the second photoresist film pattern 470 is formed on the strip-shaped polycrystalline silicon film pattern 450. As shown in FIG. 10b, the second photoresist film pattern 470 exposes areas where n-type regions of the polycrystalline silicon film pattern 450 are to be formed. Thereafter, n-type impurity ions are implanted using the second photoresist film pattern 470 as an ion implantation mask.

Figure 11:
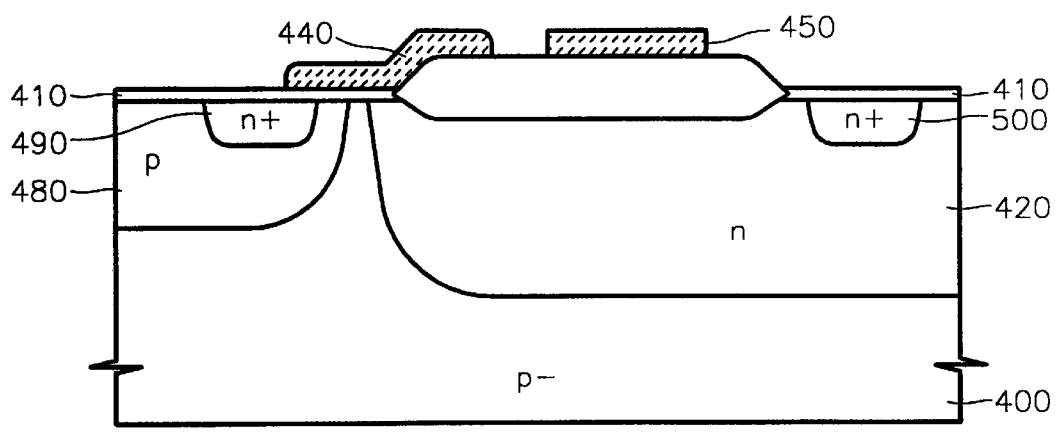

Referring to FIG. 11, the second photoresist film pattern 470 of FIG. 10A is removed, and a predetermined thermal treatment is performed on the implanted p-type and n-type impurity ions to drive-in diffuse them. In this way, a p-type well region 480, an n-type high-concentration source region 490, an n-type high-concentration drain region 500, and the p-type and n-type regions of the polycrystalline silicon film pattern 450 are formed. As described above referring to FIG. 2, the p-type and n-type regions of the polycrystalline silicon film pattern 450 alternate, such that the junctions between the n-type and p-type regions of the polycrystalline silicon film pattern 450 act as Zener diodes. Here, an n-type region formed on one end of the polycrystalline silicon film pattern 450 is directly connected to the drain region 500, and an n-type region formed on the other end thereof is directly connected to the source region 490 or connected thereto via the gate electrode 440. Thereafter, a source electrode and a drain electrode are formed through a typical metalization process, and a passivation process is then performed, thereby completing the formation of a MOS gate semiconductor device including Zener diodes according to the present invention.

FIGS. 12 through 15 are cross-sectional views illustrating a method of manufacturing a lateral MOS gate-type semiconductor device including Zener diodes, according to a second embodiment of the present invention. The manufacturing method according to this embodiment is forming Zener diodes so that the Zener diodes can be connected to each other in series in a direction parallel to the direction of current flow in a drift layer.

Figure 12:
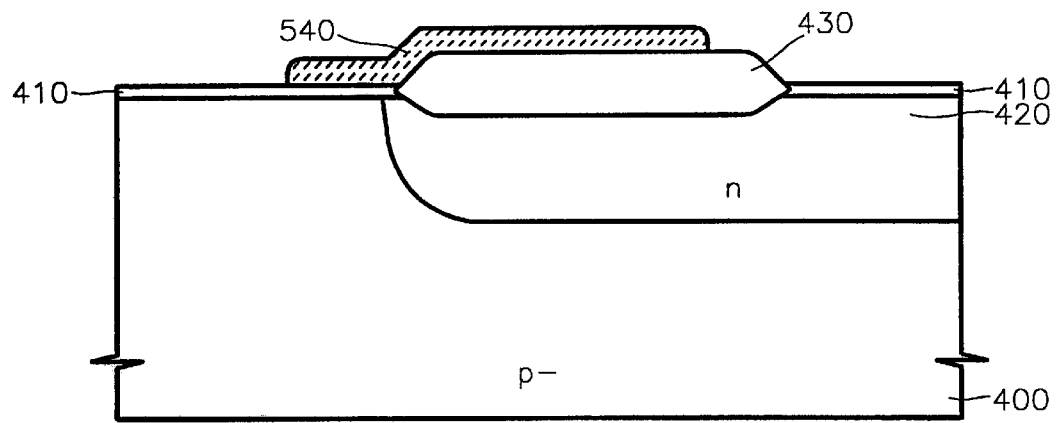
FIGS. 12 through 15 are cross-sectional views illustrating a method of manufacturing a lateral MOS gate-type semiconductor device including a Zener diode, according to a second embodiment of the present invention.

As described above referring to FIG. 7, an oxide film 410 is formed on a p-type semiconductor substrate 400. An n-type well region 420 is formed in a given area of the semiconductor substrate 400. A field oxide film 430 for isolating a drain region from a source region is then formed. Next, a polycrystalline silicon film 540 is formed on the oxide film 410 and the field oxide film 430 as shown in FIG. 12. The polycrystalline silicon film 540 constitutes a gate electrode and Zener diodes through a subsequent masking process and a subsequent ion implantation process.

Figure 13A:
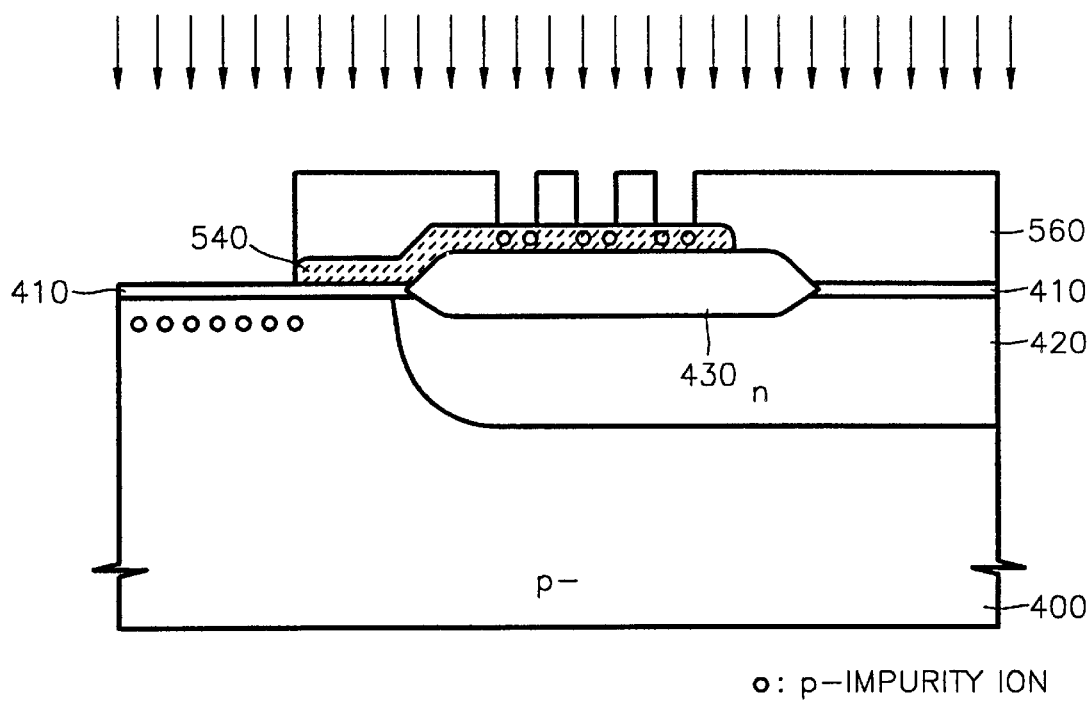
Figure 13B:
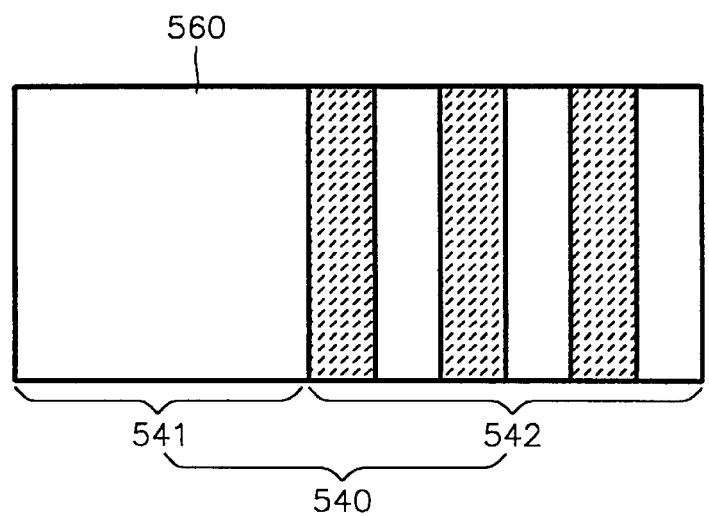

That is, as shown in FIG. 13a, a first photoresist film pattern 560 is formed as a p-type impurity ion implantation mask film. The first photoresist film pattern 560 has an aperture exposing an area where a p-type well region is to be formed, and also has apertures exposing selected areas of the polycrystalline silicon film 540. FIG. 13b shows the polycrystalline silicon film 540 viewed from the top on which the first photoresist film pattern 560 is formed. As shown in FIG. 13b, the first photoresist film pattern 560 covers the entire upper surface of a gate electrode 541, and simultaneously exposes areas where p-type regions of Zener diodes are to be formed. Thereafter, p-type impurity ions are implanted using the first photoresist film pattern 560 as an ion implantation mask.

Figure 14A:
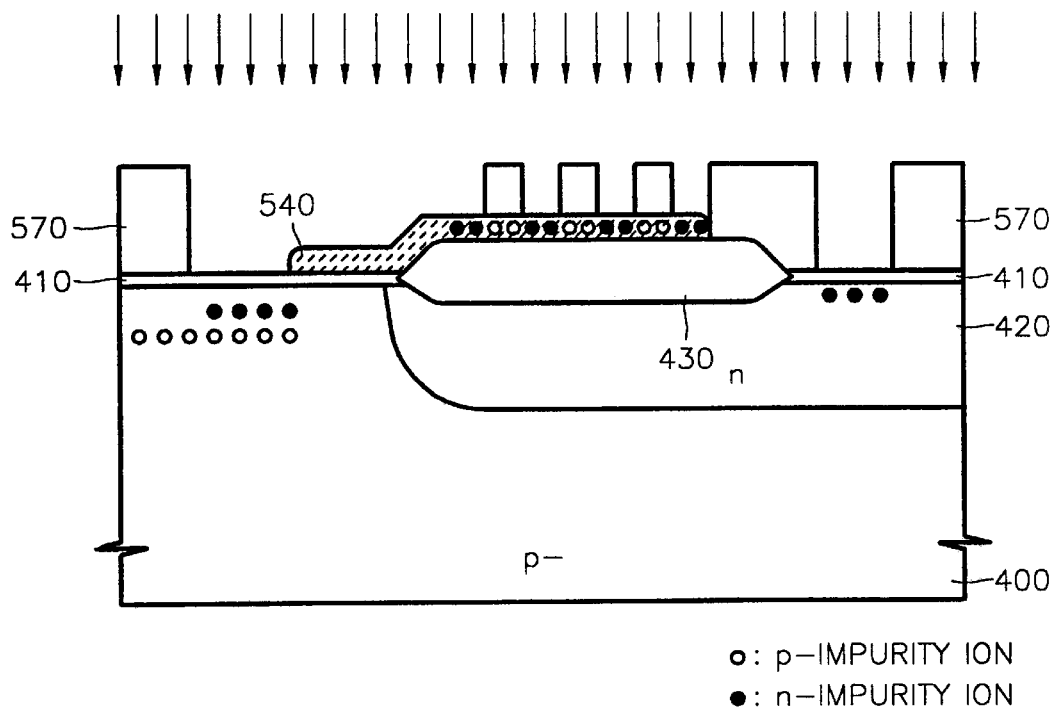
Figure 14B:
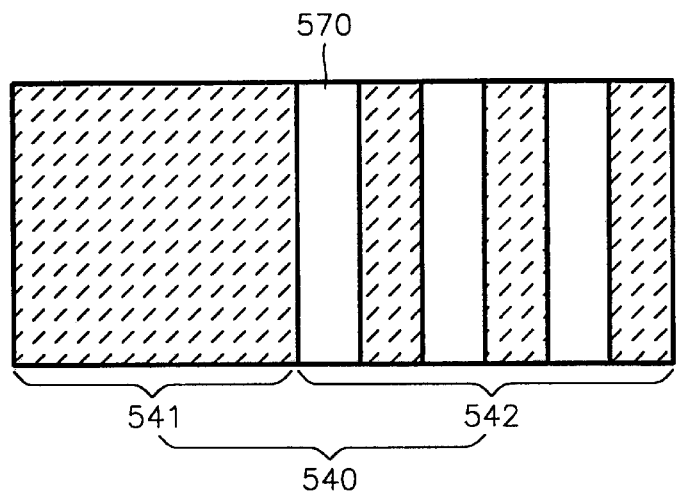

Referring to FIG. 14a, the first photoresist film pattern 560 of FIG. 13a and 13b is removed, and a second photoresist film pattern 570 is then formed to act as an n-type impurity ion implantation mask. The second photoresist film pattern 570 has apertures exposing the surface of portions where n-type source and drain regions of the semiconductor substrate 400 are to be formed, and also has apertures exposing selected areas of the gate electrode 541 and the Zener diodes 542 of the polycrystalline silicon film 540. FIG. 14b shows the polycrystalline silicon film 540 viewed from the top on which the second photoresist film pattern 570 is formed. As shown in FIG. 14b, the second photoresist film pattern 570 exposes portions where n-type regions of the gate electrode 541 and Zener diodes 542 of the polycrystalline silicon film 540 are to be formed. Thereafter, n-type impurity ions are implanted using the second photoresist film pattern 570 as an ion implantation mask.

Figure 15:
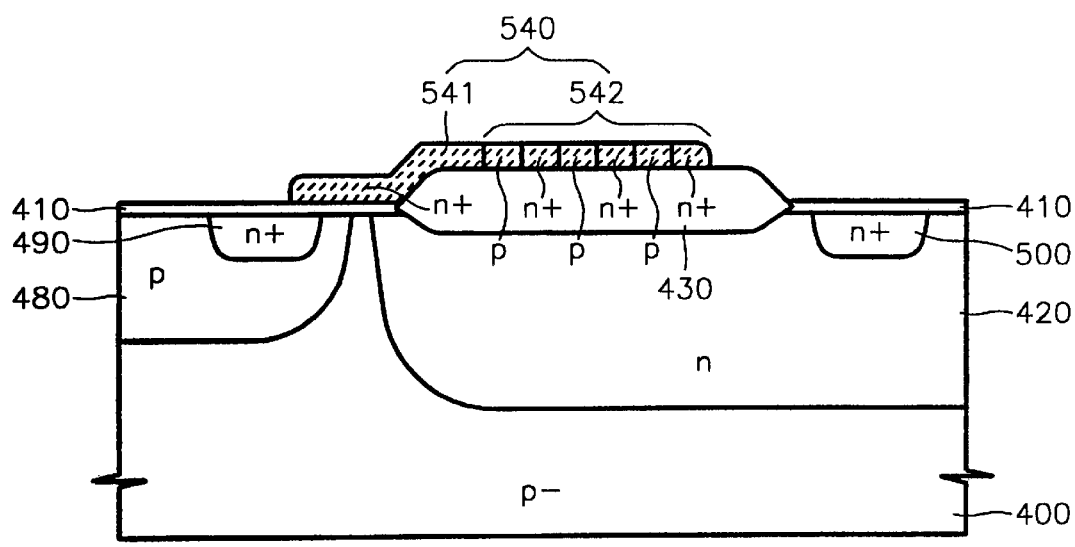

Referring to FIG. 15, the second photoresist film pattern 570 of FIG. 14a and 14b is removed, and the implanted p-type and n-type impurity ions are then drive-in diffused through a predetermined thermal treatment process. In this way, a p-type well region 480, an n-type high-concentration source region 490, and an n-type high-concentration drain region 500 are formed. The gate electrode 541 is doped with n-type impurities, and the p-type and n-type regions of the Zener diodes 542 are formed. As described above, the junctions between the n-type and p-type regions of the polycrystalline silicon film 540 act as Zener diodes.

Subsequently, an n-type region closest to the drain region 500, among the n-type regions of the Zener diodes 542, is connected directly to a drain electrode (not shown), and the gate electrode 541 doped with n-type impurities is connected to a source terminal via a special Zener diode (not shown).

What is claimed is:

1. A lateral MOS gate semiconductor device comprising:
    a drift layer of a first conductivity type, formed on a semiconductor substrate;
    a well region of a second conductivity type that is opposite to the first conductivity type, formed in a given area below the upper surface of the drift layer;
    a first high-concentration source region formed in a given area in the well region;
    a high-concentration drain region of a first conductivity type separated from the well region by a predetermined distance in a predetermined area below the upper surface of the drift layer;
    a plurality of Zener diodes having a predetermined breakdown voltage and separated from the drift layer by an insulating layer, to act as a passage for moving carriers from the drain region to the source region, said plurality of Zener diodes being connected between said source region and said drain region;
    a gate electrode formed by installing a gate insulative film on a predetermined channel forming area of the well region;
    a source electrode formed so as to be electrically connected to the source region; and
    a drain electrode formed so as to be electrically connected to the drain region, said drain electrode being coupled to a load.

2. The lateral MOS gate semiconductor device of claim 1, wherein the semiconductor substrate is of a first conductivity type high-concentration or a second conductivity type high-concentration.

3. The lateral MOS gate semiconductor device of claim 2, further comprising an insulative film interposed between the semiconductor substrate and the drift layer when the semiconductor substrate is of the first conductivity type.

4. The lateral MOS gate semiconductor device of claim 1, wherein the Zener diodes are formed on a field oxide film for isolating the source region from the drain region.

5. The lateral MOS gate semiconductor device of claim 1, wherein first conductive regions and second conductive regions constituting the Zener diodes are connected to each other in series perpendicularly to the direction of current flow in the drift layer.

6. The lateral MOS gate semiconductor device of claim 5, wherein the first and second conductive regions alternate within the polycrystalline silicon film, and the first conductive regions are positioned at both ends of the polycrystalline silicon film.

7. The lateral MOS gate semiconductor device of claim 6, wherein one first conductive region of the two positioned at both ends of the polycrystalline silicon film is connected directly to the drain region, and the other first conductive region is connected to the source region.

8. The lateral MOS gate semiconductor device of claim 7, wherein the first conductive region connected to the source region is connected directly to the source region, or connected to the source region via the gate electrode.

9. The lateral MOS gate semiconductor device of claim 1, wherein first conductive regions and second conductive regions constituting the Zener diodes are connected to each other in series such that they are parallel to the direction of current flow in the drift layer.

10. The lateral MOS gate semiconductor device of claim 9, wherein the first and second conductive regions alternate within the polycrystalline silicon film, and the first conductive region and the second conductive region are positioned respectively at both ends of the polycrystalline silicon film.

11. The lateral MOS gate semiconductor device of claim 10, wherein the first conductive region positioned at one end of the polycrystalline silicon film is connected directly to the drain region, and the second conductive region positioned at the other end of the polycrystalline silicon film is connected directly to the gate electrode, wherein the gate electrode is of a first conductivity type.

12. The lateral MOS gate semiconductor device of claim 11, further comprising a diode formed between the gate electrode and the source region, for acting as a passage for the flow of current from the Zener diodes into the source region.

13. The lateral MOS gate semiconductor device of claim 1, wherein the breakdown voltage of the Zener diodes is lower than the breakdown voltage of a parasitic diode formed by the first conductive drift layer and the second conductive well region.

14. A lateral MOS gate semiconductor device comprising:

a semiconductor substrate of a first conductivity type;

a well region of the first conductivity type and a well region of a second conductivity type formed in areas below the upper surface of the semiconductor substrate such that they are a predetermined distance apart from each other;

a high-concentration source region of the second conductivity type, formed in a given area in the well region of the first conductivity type;

a high-concentration drain region of the second conductivity type, formed in a predetermined area in the well region of the second conductivity type;

a plurality of Zener diodes having a predetermined breakdown voltage and separated from the semiconductor substrate to act as a passage for moving carriers from the drain region to the source region;

a gate electrode formed by installing a gate insulative film on a channel forming area of the well region of the second conductivity type;

a source electrode formed so as to be electrically connected to the source region; and a drain electrode formed so as to be electrically connected to the drain region.

* * * * *